US006455956B1

(12) United States Patent
Sogard

(10) Patent No.: US 6,455,956 B1
(45) Date of Patent: *Sep. 24, 2002

(54) TWO-DIMENSIONAL ELECTRIC MOTOR

(75) Inventor: Michael R. Sogard, Menlo Park, CA (US)

(73) Assignee: Nikon Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/629,792

(22) Filed: Jul. 31, 2000

Related U.S. Application Data

(62) Division of application No. 09/247,450, filed on Feb. 10, 1999, now Pat. No. 6,127,749.

(51) Int. Cl.[7] .............................................. H02K 41/00
(52) U.S. Cl. ......................................................... 310/12
(58) Field of Search ............................. 310/12, 13, 14, 310/154, 156; 318/135

(56) References Cited

U.S. PATENT DOCUMENTS

| | | | |
|---|---|---|---|
| 3,851,196 A | 11/1974 | Hinds | 310/12 |
| 4,286,197 A | 8/1981 | Eberhard et al. | 318/38 |
| 4,535,278 A | 8/1985 | Asakawa | 318/687 |
| 4,555,650 A | 11/1985 | Asakawa | 318/135 |
| 4,654,571 A | 3/1987 | Hinds | 318/687 |
| RE34,674 E | 7/1994 | Beakley et al. | 310/12 |
| 6,075,297 A | * 6/2000 | Izawa et al. | 310/12 |
| 6,127,749 A | * 10/2000 | Sogard | 310/12 |

FOREIGN PATENT DOCUMENTS

| | | |
|---|---|---|
| GB | 1424413 | 3/1973 |
| JP | 55-68865 A | 5/1980 |
| JP | 55-68868 A | 5/1980 |
| JP | 55-68869 A | 5/1980 |
| JP | 55-106070 A | 8/1980 |
| JP | 55-106072 A | 8/1980 |

(List continued on next page.)

OTHER PUBLICATIONS

Basak, Amitava, Permanent–Magnet DC Linear Motors, Clarendon Press, Oxford, Table of Contents, pp. xii–xi, 1996. (month unknown).
Fundamentals of Physics, Second Edition, Extended Version, Revised Printing, David Halliday and Robert Resnick Eds., John Wiley & Sons, Table of Contents, 8 pages total, 1986. (month unknown).
Hanselman, Duane C., Brushless Permanent–Magnet Motor Design, McGraw–Hill, Inc., Table of Contents v–viii, 1994. (month unknown).
Design of Brushless Permanent–Magnet Motors, J.R. Hendershot, Jr. and T.J.E. Miller Eds., Magna Physics Publishing and Clarendon Press, Oxford, Table of Contents, pp. vii–xv, 1994. (month unknown).

Primary Examiner—Nestor Ramirez
Assistant Examiner—Judson H. Jones
(74) Attorney, Agent, or Firm—Finnegan, Henderson, Farabow, Garrett & Dunner, L.L.P.

(57) ABSTRACT

The invention includes a two-dimensional electric motor having two arrays of permanent magnets and at least two coils. The arrays of permanent magnets each have north and south poles distributed in both longitudinal and latitudinal directions along a plane. North poles in the first array are aligned with south poles in the second array, and south poles in the first array are aligned with north poles in the second array. The coil has a portion between the two arrays of permanent magnets. In another embodiment, the two-dimensional electric motor has an array of permanent magnets and two sets of two coils. The two sets of two coils are positioned on two different sides of the array. The invention permits simpler control methods, more stable motion, increased efficiency, and reduced stray magnetic fields. The invention should be particularly useful in semiconductor processing equipment.

26 Claims, 9 Drawing Sheets

FOREIGN PATENT DOCUMENTS

| | | |
|---|---|---|
| JP | 55-106074 A | 8/1980 |
| JP | 56-004012 A | 9/1981 |
| JP | 56-114013 A | 9/1981 |
| JP | 56-114014 A | 9/1981 |
| JP | 57-149743 A | 9/1982 |
| JP | 57-149745 A | 9/1982 |
| JP | 57-149746 A | 9/1982 |
| JP | 57-165702 A | 10/1982 |
| JP | 57-165703 A | 10/1982 |
| JP | 57-165704 A | 10/1982 |
| JP | 58-56740 A | 4/1983 |
| JP | 58-56741 A | 4/1983 |
| JP | 58-56742 A | 4/1983 |
| JP | 58-56744 A | 4/1983 |
| JP | 58-173843 A | 10/1983 |
| JP | 58-173844 A | 10/1983 |
| JP | 58-173845 A | 10/1983 |
| JP | 58-175020 A | 10/1983 |
| JP | 58-175021 A | 10/1983 |
| JP | 58-175022 A | 10/1983 |
| JP | 60-234238 A | 11/1985 |
| JP | 60-234239 A | 11/1985 |
| JP | 60-234240 A | 11/1985 |
| JP | 60-261035 A | 12/1985 |
| JP | 60-261036 A | 12/1985 |
| JP | 60-261037 A | 12/1985 |
| JP | 61-126640 A | 6/1986 |
| JP | 61-126641 A | 6/1986 |
| JP | 61-126642 A | 6/1986 |
| JP | 61-180942 A | 8/1986 |
| JP | 61-180943 A | 8/1986 |
| JP | 61-180944 A | 8/1986 |
| JP | 61-258344 A | 11/1986 |
| JP | 61-258345 A | 11/1986 |
| JP | 61-258346 A | 11/1986 |
| JP | 62-54838 A | 3/1987 |
| JP | 62-54839 A | 3/1987 |
| JP | 62-54840 A | 3/1987 |
| JP | 62-100161 A | 5/1987 |
| JP | 62-100162 A | 5/1987 |
| JP | 62-100163 A | 5/1987 |
| JP | 62-207162 A | 9/1987 |
| JP | 62-207164 A | 9/1987 |
| JP | 62-207165 A | 9/1987 |
| JP | 1-291192 A | 11/1989 |
| JP | 1-291194 A | 11/1989 |
| JP | 1-291195 A | 11/1989 |
| JP | 1-317234 A | 12/1989 |
| JP | 1-317235 A | 12/1989 |
| JP | 1-317236 A | 12/1989 |
| JP | 2-55564 A | 2/1990 |
| JP | 2-55565 A | 2/1990 |
| JP | 2-55566 A | 2/1990 |
| JP | 3-178744 A | 8/1991 |
| JP | 3-178746 A | 8/1991 |
| JP | 3-178747 A | 8/1991 |
| JP | 4-112304 A | 4/1992 |
| JP | 4-112305 A | 4/1992 |
| JP | 4-112306 A | 4/1992 |
| JP | 5-296284 A | 11/1993 |
| JP | 5-296285 A | 11/1993 |
| JP | 5-296286 A | 11/1993 |
| JP | 06014900 A | 1/1994 |
| JP | 06204115 A | 7/1994 |
| JP | 07048028 A | 2/1995 |
| JP | 07060581 A | 3/1995 |
| JP | 07131966 A | 5/1995 |
| JP | 07238927 A | 9/1995 |
| JP | 07262581 A | 10/1995 |

\* cited by examiner

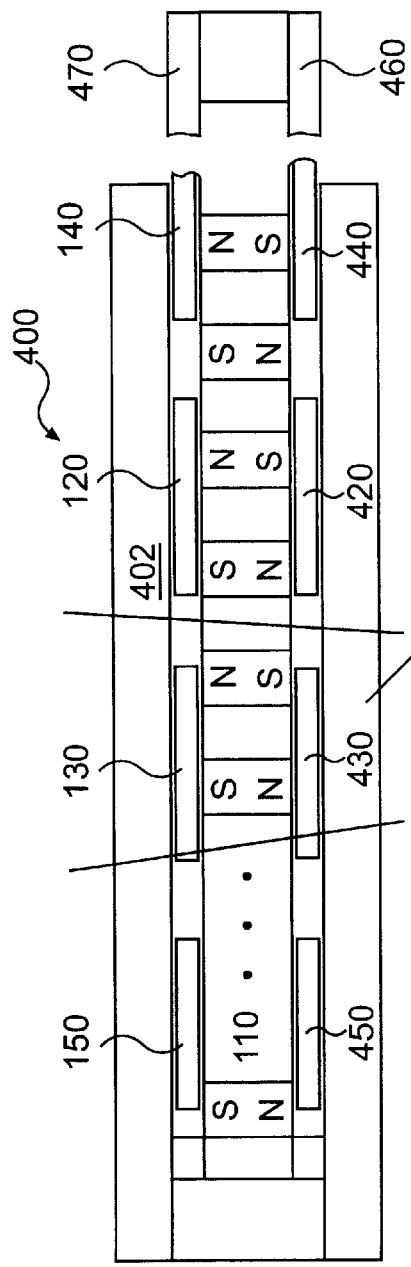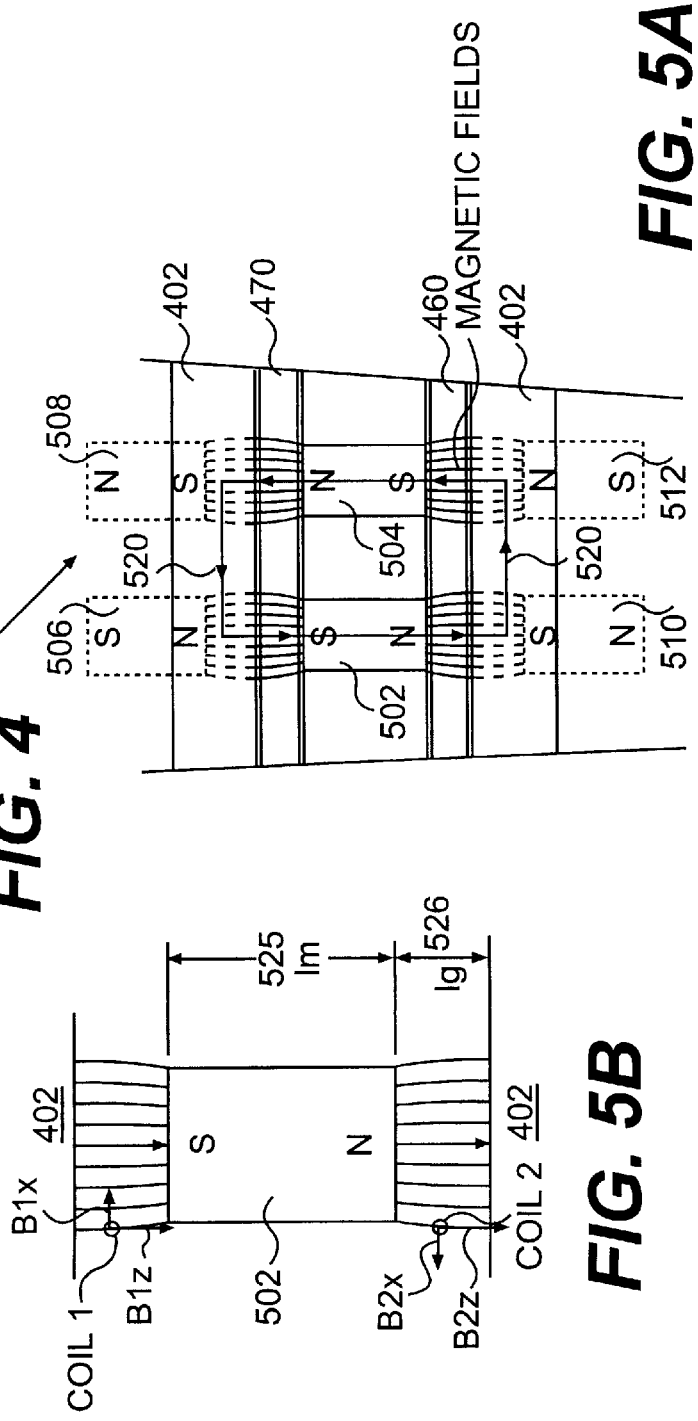

TWO-DIMENSIONAL ELECTRIC MOTOR

This application is a division of U.S. Ser. No. 09/247,450, filed Feb. 10, 1999, now U.S. Pat, No. 6,127,749.

TECHNICAL FIELD

The invention relates generally to electric motors and more specifically to two-dimensional electric motors.

BACKGROUND ART

Electric motors are used in a variety of electrical equipment. In particular, they are used in various manufacturing equipment. For example, wafer stages positioning silicon wafers during photolithography and other semiconductor processing equipment utilize linear electric motors to position the wafer or other substrates.

A typical one-dimensional linear electric motor has a magnet track with pairs of opposing magnets facing each other. Within spaces between the pairs of opposing magnets, an armature moves. The armature has windings of a conductor which are supplied with an electrical current. When the electrical current is turned on, forces proportional to the product of the current and a local magnetic field are generated to cause the armature to move. When the armature is attached to a wafer stage, the wafer stage moves in concert with the armature.

In a multiphase motor, the armature has various windings grouped into phases. The phase groups are selectively pulsed with electric current to create a more efficient motor. As the armature moves within the magnet track as a first group of coils is pulsed, the first group moves out of its optimal position between the pairs of magnets. Then, it becomes more efficient to pulse a second group of windings. More phase groups are theoretically more efficient since a more even application of force and utilization of power input is maintained. However, each additional phase group complicates a timing of the pulses to the various phase groups. Presently, three-phase motors and armatures have gained favor in balancing these considerations.

There are several types of two-dimensional linear motors. U.S. Pat. No. 4,535,278, Two Dimensional Precise Positioning Device for use in a Semiconductor Manufacturing Apparatus, issued to Teruo Asakawa on Aug. 13, 1985 and incorporated by reference herein in its entirety, describes a two-dimensional motor. This motor has four identical coils placed in a plane near and parallel to an array of permanent magnets, which are arranged in a spaced apart rectangular pattern, with magnets of like polarity disposed along diagonals. On the side of the coils opposite this array is disposed either a second identical array, or a plate of ferromagnetic material which serves as a magnetic flux return path, to complete a magnetic circuit. The coils' dimensions are approximately equal to the pitch of the magnet array, and they are square in shape. Assuming the magnet arrays to lie in the horizontal plane, the magnetic fields are primarily vertical, as are the axes of the coils. Electric currents produced in the coils generate driving forces in the horizontal plane. These forces are primarily along the axes of the magnet array.

Another version of the motor is described in U.S. Pat. No. 4,555,650, Two-dimensional Driving Device for use in a Positioning Device in a Semiconductor Manufacturing Apparatus, issued to Teruo Asakawa on Nov. 26, 1985 and incorporated by reference herein in its entirety. This second version utilizes pairs of coils which are oriented vertically and may be placed between two horizontal arrays of permanent magnets. The magnet arrays are identical to those described above, except that corresponding magnets in the two arrays are arranged in opposition; i.e., the north poles in the top array are directly above the north poles in the bottom array, and similarly for the south poles. The coil pairs have their planes parallel, and a magnetically permeable member extends between them, linking their cores. This member provides a flux return path, so that the flux from one permanent magnet approximately beneath one of the coils can link both coils of the pair before entering the adjacent permanent magnet of opposite polarity approximately beneath the other coil. If currents of appropriate polarity are passed through the coils a horizontal force along the line between the coils is produced. Similar coil pairs oriented orthogonally can produce forces in the orthogonal direction, allowing for two-dimensional motion.

U.S. Pat. No. 4,654,571, Single Plane Orthogonally Movable Drive System, issued to Walter E. Hinds (Hinds) and incorporated by reference herein in its entirety, describes another two-dimensional motor. The Hinds motor has a horizontal planar array of permanent magnets with like magnetization of magnets along rows and columns and a set of four coils attached to a platform supported above an array by air bearings. The coils are arranged in quadrants with their active turns aligned parallel to the plane of the magnet array. Coils diagonally opposite one another are aligned in parallel. Sending an electrical current through such coil pairs generates a force along one of the array axes if the coils are placed where the magnetic fields from the magnets are essentially vertical. The plane of each coil is vertical, and the length of the active turn part of the coil is a multiple of the magnet array pitch.

A relatively new application of two-dimensional linear motors is precision stage control for electron beam machines which are used for lithography, metrology, and inspection. For these applications, the stray magnetic fields from both the permanent magnets and the coils can seriously perturb the electron beam. For this reason a configuration which minimizes the stray fields is desirable.

What is needed is a linear motor providing more stable horizontal forces with higher electrical efficiency and requiring a simpler control system. Moreover it should have lower stray magnetic fields making it more suitable for electron beam applications.

SUMMARY OF THE INVENTION

The invention includes a two-dimensional electric motor. In some embodiments, the two-dimensional electric motor has two arrays of permanent magnets and at least two coils. The arrays of permanent magnets each has north and south poles distributed in both longitudinal and latitudinal directions along a plane. North poles in the first array are aligned with south poles in the second array, and south poles in the first array are aligned with north poles in the second array.

Each coil has a portion between the two arrays of magnetic poles. Electric current circulating in the coil interacts with the magnetic fields from the arrays to generate forces to cause the coil and the first and said second planar arrays of permanent magnets to move relative to one another.

In some embodiments with multiple coils, the coils are attached to a frame and are located between the two arrays of magnetic poles. The coils are rectangular, and their axes are approximately parallel to axes of the array.

In a planar design with permanent magnets, the pole faces of the permanent magnets are parallel to planes of their respective arrays. If the first array is horizontal, the second array is positioned above and parallel to it. The permanent magnets are arranged so that north poles are arranged along rows and columns, and south poles are similarly arranged, but displaced diagonally from corresponding north poles. North poles in the first array are aligned with south poles in the second array, and south poles in the first array are aligned with north poles in the second array.

In another embodiment of the invention, the two-dimensional electric motor has an array of permanent magnets combined with two sets of at least two coils. The two sets of two coils are positioned on two different sides of the array. Electric currents circulating in the coils interact with the magnetic fields from the array to cause the two sets of coils and the array to move relative to each other.

In some embodiments, on sides of the coils opposite from and parallel to the permanent magnet array, two plates of magnetically permeable material are positioned to serve as flux return paths.

In the various motor embodiments, the coils' dimensions may be integer or half integer multiples of a pitch of the array. By pitch we mean the distance between a permanent magnet of a specific orientation of north and south poles and the nearest permanent magnet with the same orientation. Pitch is defined along the axes of symmetry of the array. Additional coils, similar to the ones described, can be added to provide a fine degree of rotational control to the motor.

Also, in the various motor embodiments, peripheries of the magnet arrays may include permanent magnets specially designed to reduce intensity of the array's magnetic fields outside the array. This feature permits the invention's electric motor to be used near magnetically sensitive equipment such as electron beam machines which are used for lithography, metrology, and inspection.

By having two magnet arrays and two coils, or two sets of two coils, a magnet array and flux return plates, the invention creates a situation where the forces generated are almost entirely parallel to the plane of the arrays. By using coils with dimensions greater than the magnet array pitch, the small differences in permanent magnet properties can be averaged over multiple magnets. These features simplify the motor control design. The motor geometry also ensures that up to nearly 50% of the current delivered to the coils can contribute to the forces on the coils compared with a lower percentage in conventional motor designs.

These and other objects, features, and advantages of the invention will become readily apparent to those skilled the art upon a study of the following drawings and a reading of the description of the invention below.

BRIEF DESCRIPTION OF THE DRAWINGS

FIG. 4 is a diagrammatic representation of a cross-sectional side view of an embodiment of a two-dimensional linear electric motor in accordance with the present invention.

FIG. 5A is a diagrammatic representation of a cross-sectional side view of a section of an embodiment of a two-dimensional linear electric motor in accordance with the present invention.

FIG. 5B is a diagrammatic representation of a cross-sectional side view of a magnet in a magnet array in an embodiment of a two-dimensional linear electric motor in accordance with the present invention.

DESCRIPTION OF THE INVENTION

For background material, the reader is directed to the following standard textbooks all of which are incorporated by reference herein in their entirety: *Permanent-Magnet DC Linear Motors*, Amitava Basak, Clarendon Press, 1996; *Fundamentals of Physics*, Second Edition, Extended Version, Revised Printing, David Halliday and Robert Resnick, John Wiley & Sons, 1986; *Brushless Permanent-Magnet Motor Design*, Duane C. Hanselman, McGraw-Hill, 1994; *Design of Brushless Permanent-Magnet Motors*, J. R. Hendershot, Jr. and T. J. E. Miller, Magna Physics Publishing and Clarendon Press, 1994. Background material may also be found in the U.S. Patents described above and in U.S. Pat. No. Re. 34,674, Linear Motor, issued to Bruce E. Beakley and Thomas E. Flanders on Jul 26, 1994 (Beakley et al.), the entirety of which is incorporated by reference.

Figure 1A:
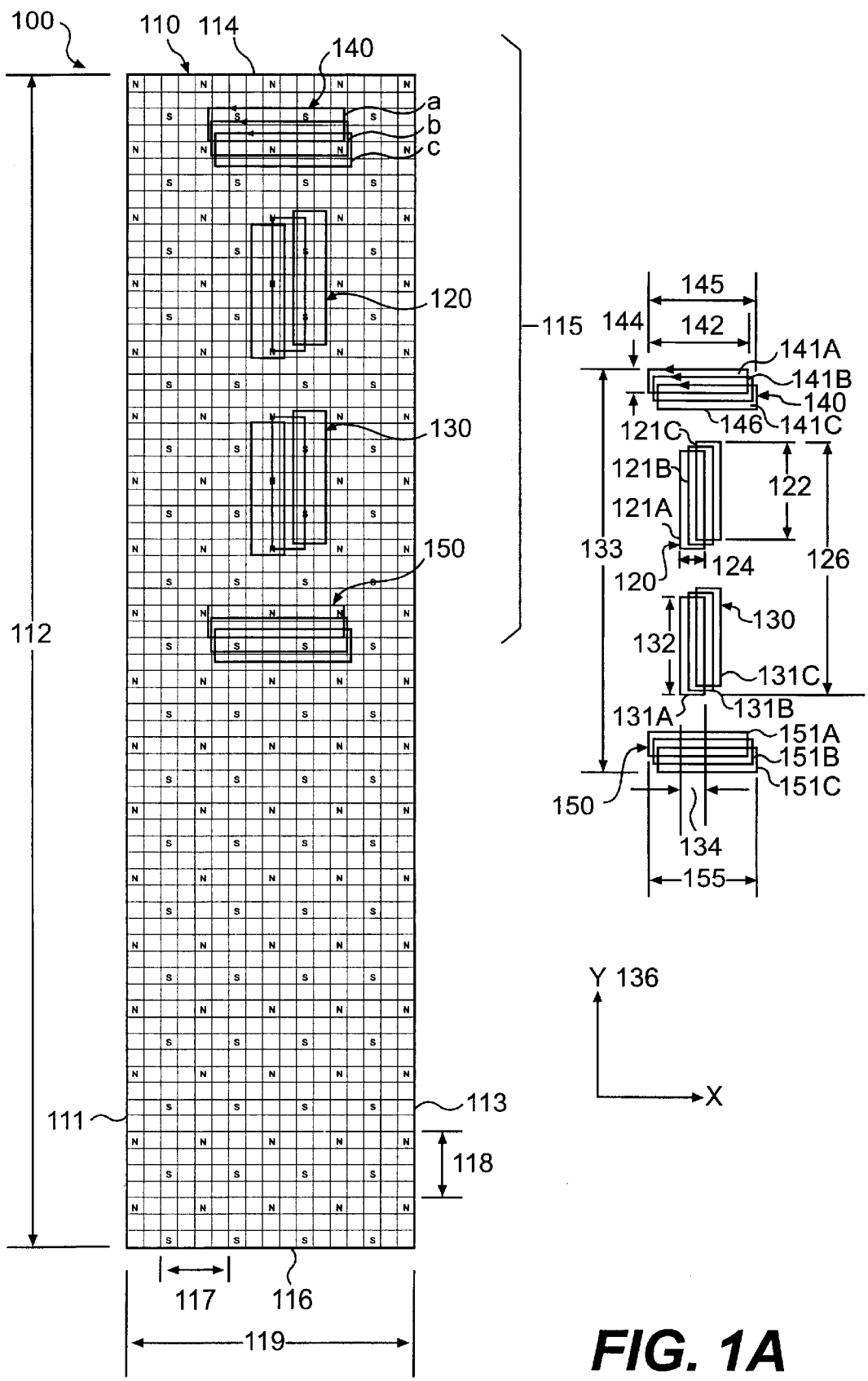
FIGS. 1A and 1B are diagrammatic representations of plan views of embodiments of magnet-and-coil arrangements for use in a two-dimensional linear electric motor in accordance with the present invention.

FIG. 1A is a diagrammatic representation of a plan view of an embodiment of a magnet-and-coil arrangement 100 which is used in two-dimensional linear electric motors in accordance with the present invention. The magnet-and-coil arrangement 100 has a planar array 1 10 of permanent magnets, X coils 120 and 130, and Y coils 140 and 150. The embodiment 100 is only exemplary. Therefore, a distribution and number of permanent magnets need not be identical to the embodiment 110, and the number of X coils 120, 130 and Y coils 140, 150 depends upon the embodiment of the invention.

For example, the four coils shown are approximately equal in size. Therefore, for a given amount of electrical current flowing through them, the force the coils can exert in the X or Y direction is approximately equal. A single Y coil of twice the length would provide approximately as much force as either coil 140 or coil 150. However, the range the coil assembly could travel in the X direction without crossing the edges of the magnet array would be reduced. On the other hand, if less force is required for motion in the Y direction, a single, shorter Y coil 140 might be sufficient.

The X and Y coils are held together to form a coil assembly 115. This coil assembly could then be attached to a stage or platform, whose position could then be controlled by the motor. Depending upon the embodiment, a second array of permanent magnets may be placed to line up permanent magnets in the planar array 110 and have the X coils 120, 130 and the Y coils 140, 150 between the two planar magnetic arrays. Such an embodiment is diagrammatically illustrated in FIG. 3 described below.

In some embodiments, each of the coils 120, 130, 140, and 150 have corresponding coils of the same size and shape on an opposite side of the array 110 of permanent magnets. In this embodiment, the coils on both sides of the array 110 of permanent magnets are attached to each other such that they move together. This embodiment will be described in further detail below with reference to FIG. 4.

The array 110 of permanent magnets is planar in the embodiment in FIG. 1A although it may have other shapes in other embodiments. The array 110 has both north and south poles, denoted by N and S, distributed in both longitudinal and latitudinal directions along a plane. Some embodiments, such as the embodiment 110, have the permanent magnets. periodically distributed in the longitudinal and/or the latitudinal directions. FIG. 1A depicts an embodiment with permanent magnets distributed in both directions. The embodiment in FIG. 1A also shows an alternating pattern of north and south poles along diagonals of the array 110 and is rectangular in its distribution of north and south poles.

Various relationships may exist between strengths of the permanent magnets in the array 110. In some embodiments, it is desirable that the permanent magnets have the same strength (the north and south poles having different polarities). The strength is proportional to the product of the magnetic flux density at the pole face and the area of the pole face. In rectangular embodiments of the array 110, some embodiments have permanent magnets on the edges at one-half or three-quarters the strength of permanent magnets not on the boundary of the rectangular array 110. Some embodiments also have permanent magnets at corners of the rectangular array 110 with quarter-strength poles when compared with the strength of poles not on the boundary of the rectangular array 110. These one-half, three-quarters, and quarter strength poles on the boundary of the rectangular array 110 help to maintain constant motor efficiency out to the edge of the array and decrease magnetic fringing effects at edges of the magnetic array 110. The decreased fringing diminishes disruption of function of equipment sensitive to magnetic fields which may be near the two-dimensional electric motor.

X coil 120 has a length 122. and a width 124 while X coil 130 has a length 132 and a width 134. A total length 126 of the X coils 120 and 130 determines how much travel the coils have in a Y direction 136. Since the combined length 126 is less than a length 112 of the array 110 of permanent magnets, the X coils 120 and 130 do not move past ends 114 and 116 of the array 110 of permanent magnets in some embodiments.

By restricting the X coils 120 and 130 to not move past the ends 114 and 116, the X coils 120 and 130 stay within the influence of the permanent magnets on the array 110. This restriction maintains a constant efficiency of the two-dimensional electric motor for motion in the X direction and minimizes an amount of magnetic fringing field, associated with the electrical currents in the coils, escaping from the motor.

Note that in such embodiments, one of the Y coils would-then extend beyond the array and be unable to provide force; the other Y coil remaining within the array 110 would provide all the available Y force. In other embodiments, where the total length 132 of the coil assembly 115 is less than the length of the array 112, it may be desired to limit travel in the Y direction, so that both Y coils remain within the array's boundaries at all times.

For similar reasons, the Y coils may be restricted to remain within the confines of the array 110 for motion in the X direction as well. This limits the motion of the coil assembly in the X direction to approximately a difference between a width of the magnet array 119 and a total length 145 of the Y coil assembly 140, assuming the length 145 to either be equal to or greater than an equivalent length 155 of the other Y coil assembly 150.

As mentioned earlier, the number of Y coils may vary, depending on the required amount of travel in the X direction and the amount of force required in the Y direction. There are at least two X coils, however, as shown in FIG. 1A. By supplying slightly different amounts of current to the two X coils a torque can be applied to the coil assembly 115 causing it to rotate. As long as a total rotation angle is small, normal operation of the motor is unaffected. For the Y coils, this implies that a position of one end of a Y coil relative to a magnet should differ only slightly from an equivalent relative position at the other end of the coil for a magnet in the same row of the array. A corresponding relation exists for the X coils. This feature permits fine rotational control of a stage or platform attached to the coil assembly 115. In other embodiments the order of the coils could be different, e.g., X, Y, Y, X or X, Y, X, Y, instead of Y, X, X, Y in FIG. 1A.

When the two-dimensional linear electric motor is a multi-phase motor, the X coils 120, 130 have multiple phases. Windings associated with the same phase are electrically connected to each other in some of the embodiments. The multiple phases of each X coil are drawn separated for clarity. However, their coil dimensions are ideally identical. Widths 124 and 134 are odd multiples of half of a unit latitudinal periodicity (pitch) 117 of the array 110. Lengths 122 and 132 are integer multiples of unit longitudinal periodicity 118 of the array 110. Windings 121A, 121B and 121C are overlapped to form a three-phase embodiment of the coil 120 as shown in FIG. 1A. Techniques for overlapping the windings 121A, 121B and 121C can be found in Beakley et al. Similarly, windings 131A, 131B and 131C are overlapped to form a three-phase embodiment of the X coil 130 depicted in FIG. 1A.

The embodiment of the Y coil 140 shown in FIG. 1A is also a three-phase coil although the invention may have other numbers of phases. Windings 141A, 141B and 141C are combined or overlapped to form the three-phase embodiment of the Y coil 140. Y coil 150 is similarly constructed.

In the embodiment shown in FIG. 1A, the Y coils 140 and 150 have a length shorter than the width 119 of the magnet array 110. Similar to the case with the X coils, restricting motion of the Y coils in the X direction so that they do not move past ends 11 I and 113 of the magnet array 110 maintains a constant efficiency for operation of the motor in the Y direction. A width 144 of Y coil 140 is an odd multiple of half of the array periodicity, or pitch 118. The length 142 of the Y coil 140 is an integer multiple of the pitch 117. This is true for each phase of the Y coil. Identical relations exist for Y coil 150.

In some embodiments, the X coils 120, 130 and Y coils 140, 150 each define areas that are large enough to overlap two or more permanent magnets in the array 110 of the same magnetic orientation. For example, X coil 120 is large enough to cover two north poles or two south poles in some embodiments. By overlapping or covering several poles of the same type, movement of the coils becomes more stable, because deviations in magnet strength are averaged over more magnets. Also, since more magnetic flux is intercepted by the coil, the force generated by the motor will be greater for larger coils.

In FIG. 1A the magnet rows and columns are separated by row and column spaces of equal size. This condition is not required for the present invention. It was chosen to simplify the later Figures. Furthermore, the longitudinal and latitudinal pitches need not be identical.

The periodicity of the array and the arrangement of like poles along rows and columns oriented in the X and Y directions are properties of the array relevant to embodiments of the invention. The size of the magnets is limited only by these conditions.

Figure 1B:
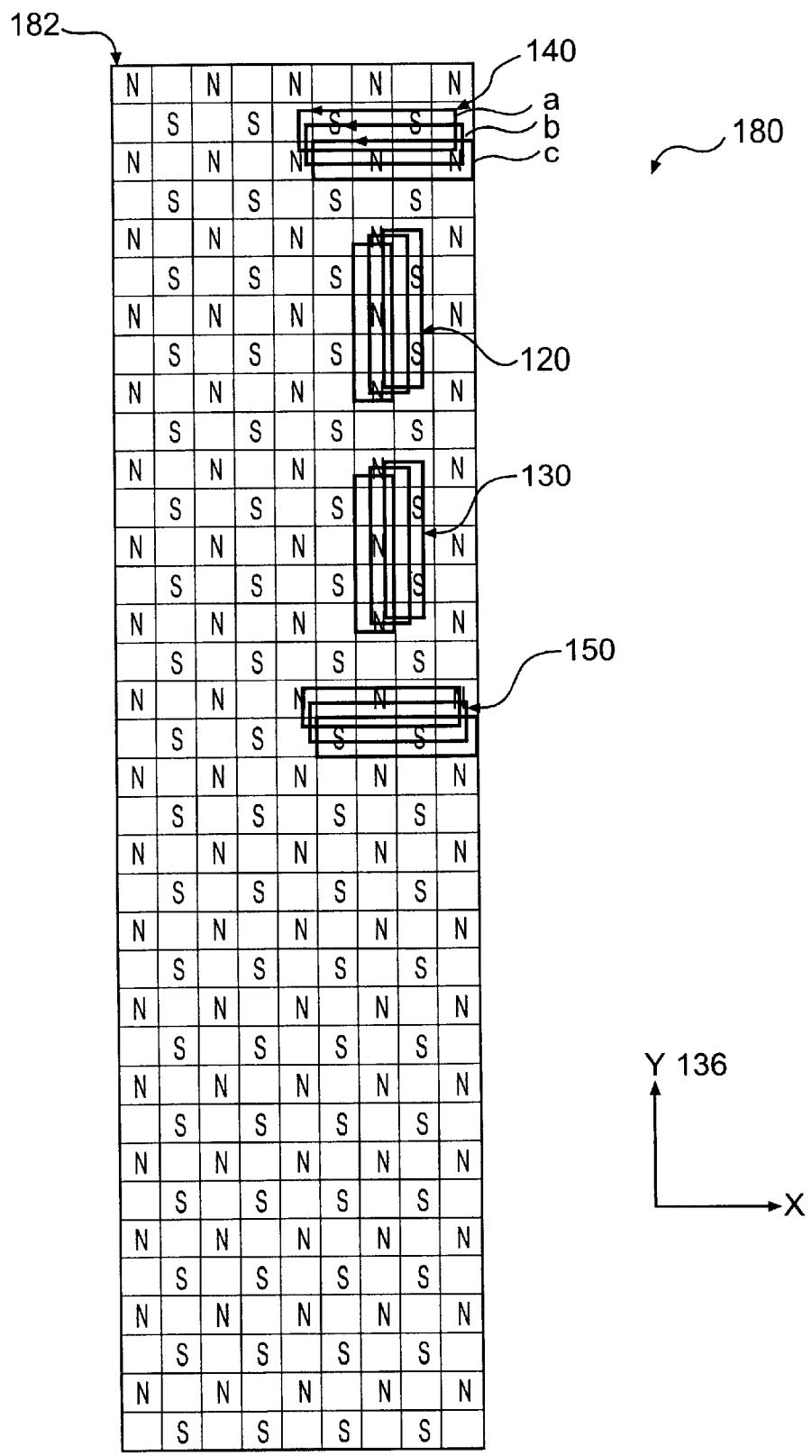

An example of another embodiment of a magnet-and-coil arrangement 180 having a compact magnet array 182 is illustrated in FIG. 1B. The coils 120, 130, 140, and 150 are the same as in the embodiment 100 in FIG. 1A. The magnets in the compact-magnet array 182 are almost touching along diagonal directions. If the magnet poles of opposite polarity get too close, some distortion of the magnetic fields might occur; instead of going to the corresponding magnet in the other array, some of the field lines might go to the nearest opposite polarity magnets in the same array. This would probably cause a slight weakening of the force when the coils are near the edges of the permanent magnets. Such a weakening could be corrected, if desired, by the control system.

From the relationships between the coil dimensions and the array periodicity, it is clear that the coils can be considerably larger than the array pitch. For example, the X-coil could have a width 134 of half the pitch 117 while the length 132 could be n units of pitch 118 where n is an integer. The integer n must be small enough to permit the desired travel range for a given magnet array size. From an inspection of FIG. 1A, it should be clear that at least one phase of such a coil will cover on average n permanent magnets of one polarity and n permanent magnets of the opposite polarity.

The fraction of the coil immersed in magnetic fields, which can provide a net force if current is applied to the coil, will approach $2n/(4n+2)$, if the compact magnet array is used. As the integer n grows, this ratio approaches 0.5. This also means that up to half the power applied to the coil can contribute to generating a net force. Thus, the present motor should be capable of more efficient operation than conventional designs.

Figure 2A:
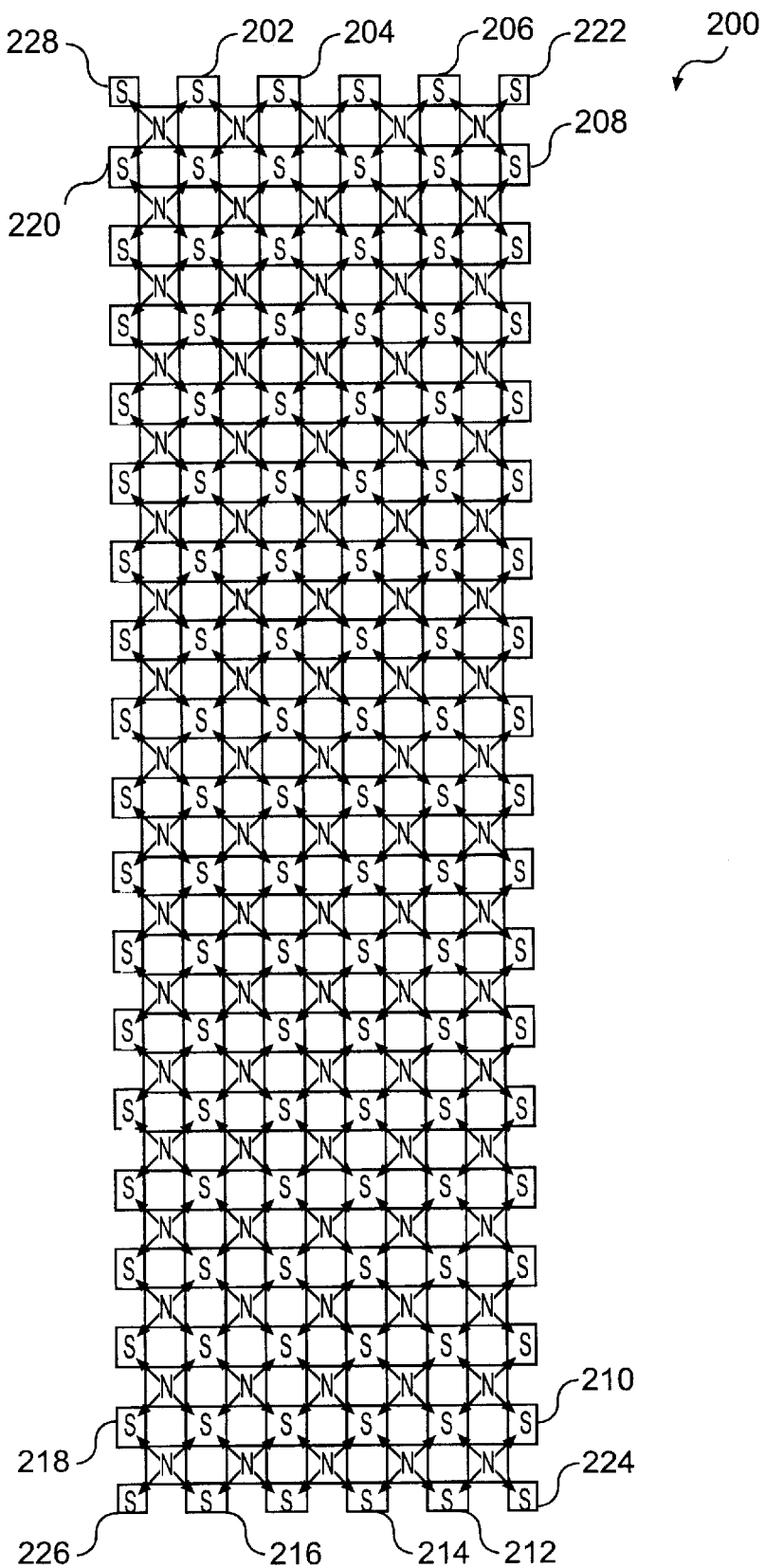
FIGS. 2A and 2B diagrammatically illustrate embodiments of arrays of magnetic poles for use in a two-dimensional linear electric motor in accordance with the present invention.

FIG. 2A is a diagrammatic representation of an embodiment 200 of the planar array of permanent magnets 110. In this embodiment, all the interior permanent magnets have the same magnetic strength. North magnetic poles are indicated by N, and south magnetic poles are indicated by S. Edge permanent magnets which are not at corners, such as permanent magnets 202, 204, 206, 208, 210, 212, 214, 216, 218 and 220, have half the strength of the interior permanent magnets. Corner permanent magnets, such as permanent magnets 222, 224, 226 and 228, have one-quarter strength of the interior permanent magnets. The relative strengths are indicated schematically by the number of arrows emanating from the north poles.

Figure 2B:
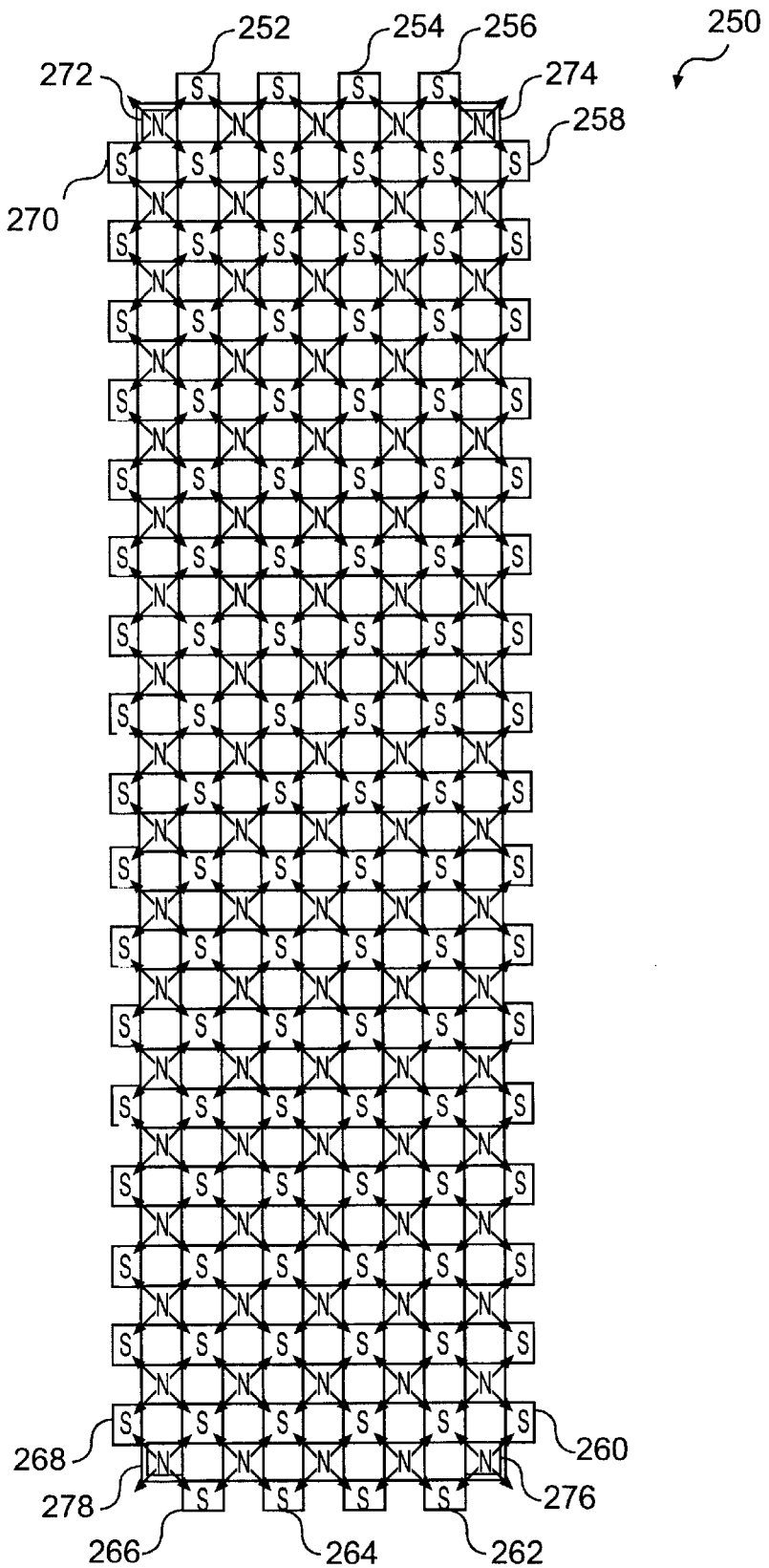

FIG. 2B diagrammatically illustrates another embodiment 250 of the array of permanent magnets 110. As in embodiment 200, interior permanent magnets in the embodiment 250 all have the same strength. Also as in embodiment 200, permanent magnets on the edges, such as permanent magnets 252, 254, 256, 258, 260, 262, 264, 266, 268 and 270, have one-half the strength of the permanent magnets in the interior of the embodiment 250. However, there are no corner permanent magnets as in the embodiment 200. Unlike the embodiment 200, permanent magnets 272, 274, 276 and 278 have three-quarters the strength of magnets in the interior.

The embodiments 200 and 250 both are designed to decrease fringe magnetic fields which would occur at the edges of the embodiments 200 and 250 if all the permanent magnets in the interior and on the edges were the same strength. This also ensures the motor properties do not change if the coils are close to an edge of an array. Such embodiments 200 and 250 may be designed by determining for each permanent magnet how many permanent magnets of opposite magnetic orientation are adjacent to the permanent magnet.

Figure 3:
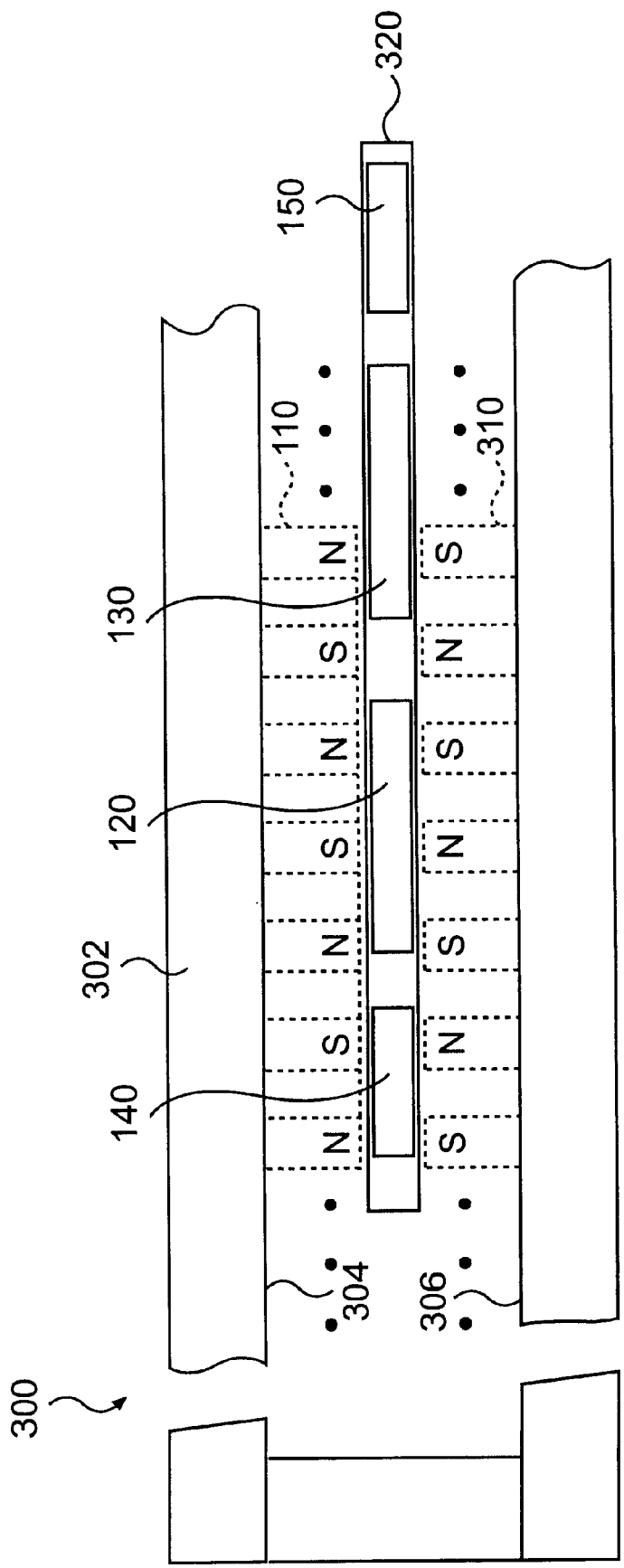
FIG. 3 is a diagrammatic representation of a section of an embodiment of a two-dimensional linear electric motor in accordance with the present invention.

FIG. 3 is a diagrammatic representation of a cross-sectional side view of an embodiment of a two-dimensional electric motor 300 in accordance with the present invention. The embodiment 300 includes the magnet-and-coil arrangement 100 and a second planar array 310 of permanent magnets. Both planar arrays 110 and 310 of permanent magnets are attached to an enclosure 302, and each magnetic pole in the array 110 is aligned with an opposite polarity magnetic pole in the array 310 and vice versa. A two-dimensional armature 320 moves between the magnet arrays 110 and 310 and includes the X coils 120 and 130 and the Y coils 140 and 150. In other embodiments, instead of being attached to walls 304 and 306 of the enclosure 302, the array 110 is at a distance from the wall 304 which equals a distance which the array 310 is from the wall 306. In some embodiments, the enclosure 302 contains a ferromagnetic material such as soft iron which will reduce fringe fields from the motor and increase the magnetic field between the arrays. In some embodiments, the enclosure 302 may be a ferromagnetic material of high electrical resistivity, such as a ferrite, to reduce generation of eddy currents. The eddy currents might make precise control of the motor more difficult. Other embodiments of arrays 110 and 310, such as the embodiments 200 and 250 as shown in FIGS. 2A and 2B, may be substituted.

FIG. 4 is a diagrammatic representation of an embodiment of a two-dimensional linear electric motor 400 in accordance with the present invention. The embodiment 400 includes the magnet-and-coil arrangement 100 and has armature components 460 and 470. The armature component 470 includes the X coils 120 and 130 and the Y coils 140 and 150, and the armature component 460 includes X coils 420 and 430 and Y coils 440 and 450 which are substantially identical to coils 120, 130, 140 and 150, respectively. The planar array 110 of permanent magnets is placed between the armature assemblies 470 and 460 and is attached to an enclosure 402. The X coils 120 and 420 are aligned with each other as are the X coils 130 and 430, the Y coils 140 and 440, and the Y coils 150 and 450. The enclosure 402 contains a magnetically permeable material such as soft iron. The soft iron completes a magnetic circuit and provides a flux return path. This allows more of the magnetic flux to link the coils and contribute to the force when current flows in the coils. It also reduces fringe magnetic fields which could affect the performance of nearby magnetic field sensitive equipment.

Again, the number of coils in this embodiment can vary. For example, all of the functions enumerated for this motor could be achieved using the two X coils 120 and 130 and one Y coil, either 440 or 450, or equivalent combinations.

FIGS. 5A and 5B are diagrammatic representations of a section of the embodiment 400. The enclosure 402 alters the magnetic fields from the permanent magnets in the region of the armatures as can be understood from magnetostatic image theory. Permanent magnets 502 and 504 which are part of the array 110 of permanent magnets, in the presence of the enclosure 402, produce fields in regions of the armatures equivalent to that from magnets 502 and 504 plus a presence of "image" magnets 506, 508, 510. and 512 with the enclosure 402 removed. The separation between the inner edge of the enclosure 402 and the nearer pole face of the image magnets 506, 508, 510 and 512 is equal to the gap between the enclosure 402 and the magnet array 110. The embodiment 400 has a greater maximum force available than the embodiment 200 because it has dual sets of coils 120 and 420, 130 and 430, 140 and 440, and 150 and 450, in the armature components 470 and 460. This embodiment has the further advantage of using fewer magnets; with current technology, magnet arrays generally cost more than coils.

Although a maximum force of the embodiment 400 is greater than that of the embodiment 300, a force for the embodiment 400 will generally be less than a factor of 2 greater than the embodiment 300. This is because a magnetic flux density within gaps separating the magnet array from the enclosures is less than that between corresponding magnets of the two arrays of embodiment 300. From magnetostatic image theory, the magnetic flux density within the gap is equivalent to that between two arrays of permanent magnets separated by twice the gap distance.

This assumes that the magnetic permeability of the enclosure is much greater than that of free space. This is determined both by proper selection of the ferromagnetic material of the enclosure, and by insuring that the flux density within the enclosure material does not exceed levels where magnetic saturation occurs.

If saturation were to occur, the permeability of the material would fall, and some of the magnetic flux would "leak out" of the enclosure. This may affect the uniformity of the magnetic flux between the enclosure and the magnetic array. It may also increase an amount of magnetic stray field escaping from the motor.

However, as shown below, from demagnetization properties of permanent magnets, dependence of the magnetic flux density within the gap typically depends less than linearly upon the gap distance.

Figure 6:
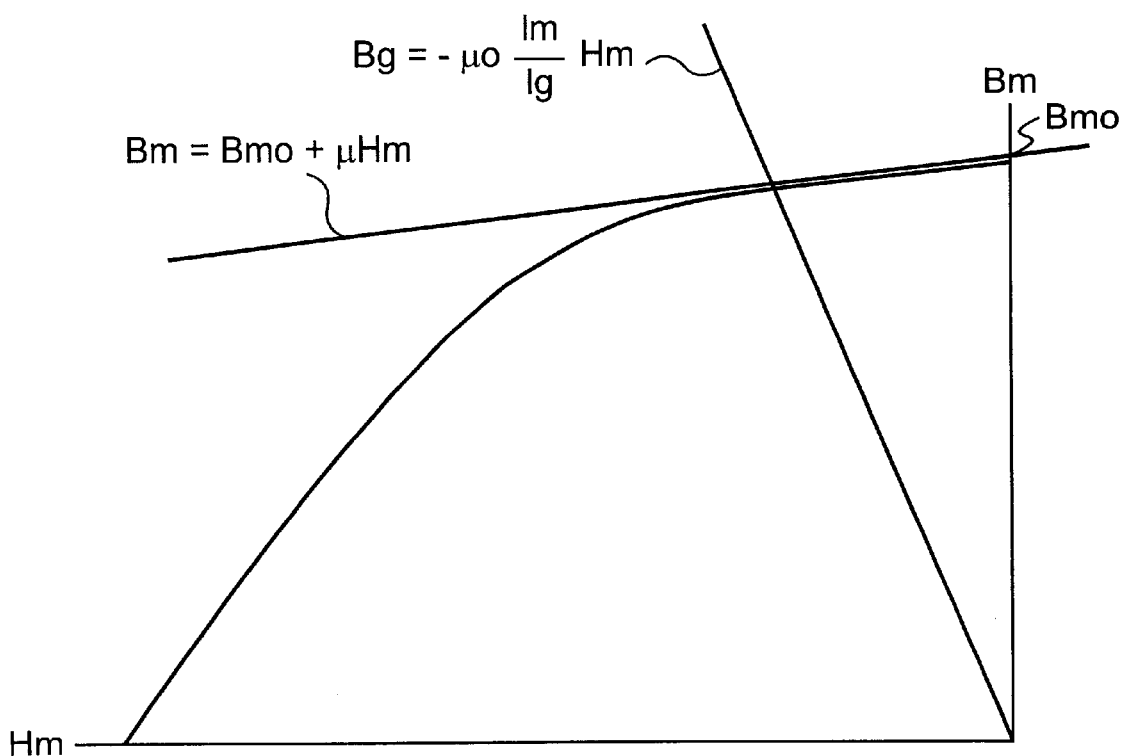
FIG. 6 is a graph of a magnetic flux density $B_m$ versus a magnetic intensity $H_m$ within a two-dimensional motor in accordance with the present invention.

The magnetic flux in the gaps occupied by the coil assemblies 470 and 460 will now be examined in detail. FIG. 6 is a graph of a demagnetization or hysteresis curve for a permanent magnet. From magnetic circuit theory applied to a closed flux circuit path 520 through adjacent pairs of magnets 502 and 504, to a good approximation, the magnetic flux density in the gap $B_g$ can be related to a magnetic intensity of the magnet, $H_m$, by the relation $$B_g = -\mu_o 1_m H_m / 1g,$$

where $\mu_o$ is the permeability of free space, $1_m$ is the magnet length 525 and $1_g$ is the gap distance 526, as shown in FIGS. 5A and 5B. If this relation is plotted on the demagnetization curve, the intersection of the two lines gives the values of $H_m$ and $B_g$ achieved in the closed flux circuit 520. If the demagnetization curve in the vicinity of the intersection is approximated by a straight line, as shown in FIG. 6, the intersection is determined from the relation $$B_g = -\mu_o 1_m / 1_g H_m = B_{m0} + \mu H_m,$$

where $\mu$ is the slope of the straight line approximation. Solving for $B_g$ satisfying both these, I obtain $$B_g = B_{m0} / (1 + \mu / \mu_o 1_g / 1_m).$$

Note that $1_g < 1_m$, and the slope of the demagnetization curve is frequently small near typical intersection points. For example, for neodymium-iron-boron magnets, $\mu/\mu_o \approx 1.03$ and $B_{m0} \approx 1.2$ W/m². Then, if $1_g/1_m \approx 0.25$ initially, $B_g$ changes from 0.795 $B_{m0}$ to 0.66 $B_{m0}$ when the gap is doubled, a change of about 17%.

Therefore the magnetic flux density is not much smaller in the embodiment 400 than that in the embodiment 300. Thus with two sets of coils, greater forces in the embodiment 400 than in the embodiment 300 (for the same number of turns of wire in the coils) are possible. Also, only half as many permanent magnets are required in the embodiment 400. Alternatively, for a given required force, less current would flow in each set of coils than in the single set of embodiment 100. The lower current decreases coil heating.

Note that the magnetic flux density is no longer symmetric about the median plane of the gaps between the array 110 and the enclosure 402 occupied by the coil assemblies 470 and 460. Therefore the coils will experience vertical forces when excited. However, as shown in FIG. 5B, note that in the two gaps, $B_z$, the magnetic flux density component providing the transverse force when a current flows in the coil, is in the same direction, so if the current flows in the same direction in both coils, the forces on the two coils add. However the $B_x$ component in the two gaps is in the opposite direction, so forces normal to the coil motion direction tend to cancel. Thus, vertical forces on the coil will in principle cancel out. There is generally no such cancellation possible in the single coil embodiment.

This cancellation is generally not perfect since the magnetic flux density distributions are generally not identical. However, by varying the currents in the corresponding coils in the coil assemblies 450 and 460 appropriately, perfect cancellation is possible. Assuming the coil current to flow in the y direction, the vertical (z) and horizontal (x) forces on the coils can be written as:

$$F_x = N_1 I_1 B_{1z} + N_2 I_2 B_{2z},$$

$$F_z = N_1 I_1 B_{1x} - N_2 I_2 B_{2x},$$

where $N_1$ and $N_2$ are the number of turns of wire in coils 1 and 2, respectively.

But $F_z = 0$ if $$I_1 = N_2 I_2 B_{2x} / N_1 B_{1x}.$$

We can maintain this relationship and are still free to adjust $I_1$ and $I_2$ to achieve any value of the force $F_x$ required by the control system.

Figure 7A:
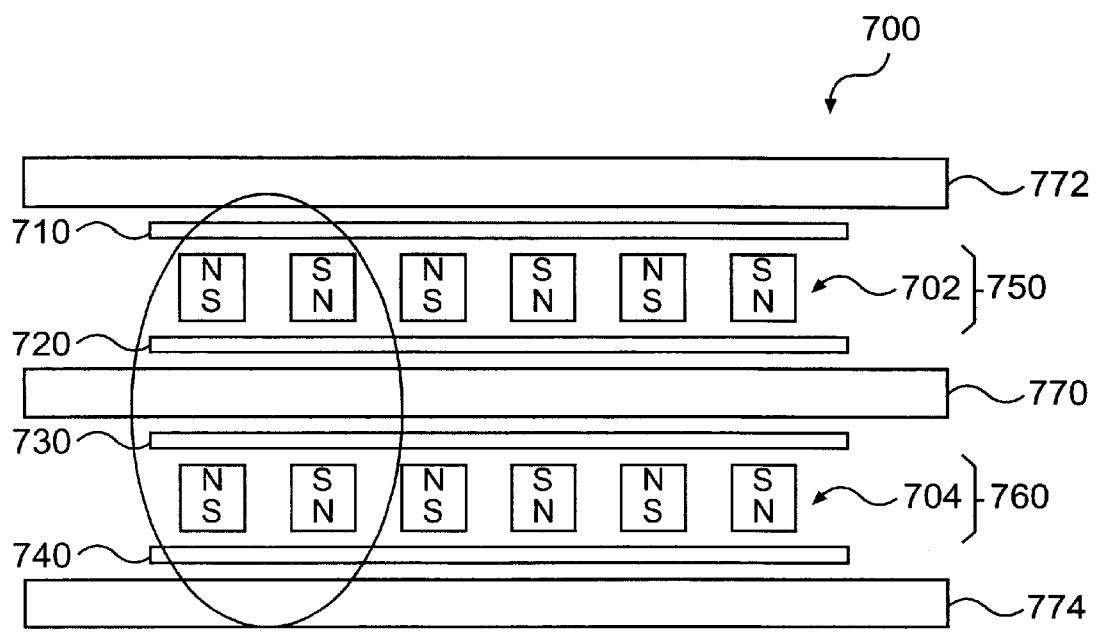
FIGS. 7A and 7B diagrammatically illustrate a cross-sectional side view of an embodiment of a two-dimensional linear electric motor in accordance with the present invention.

Embodiments of the magnet-and-coil arrangement 100 described above may be stacked to form other embodiments of the two-dimensional electric motor. For example, FIG. 7A diagrammatically illustrates a cross-sectional side view of an embodiment 700 of a two-dimensional linear electric motor in accordance with the present invention. The embodiment 700 has arrays of permanent magnets 702 and 704. In the embodiment shown in FIG. 7A, the permanent magnets in the array 702 have the same orientation as those in the array 704 to form closed magnetic flux circuits using magnetic poles of both arrays 702 and 704.

Figure 7B:
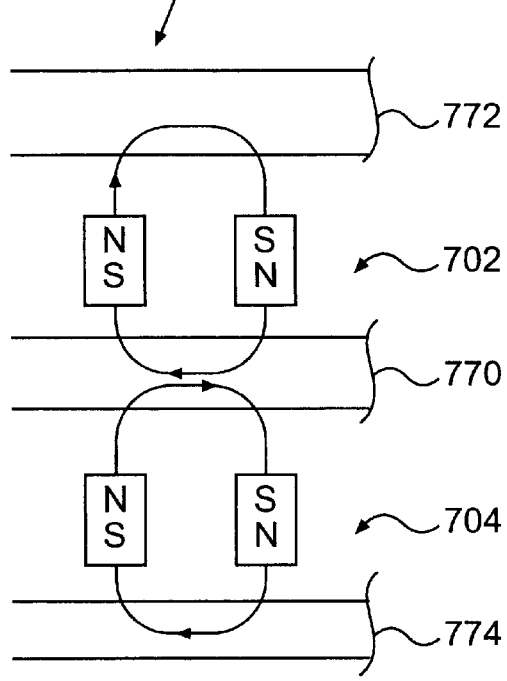

There is some advantage to this selection of polarities, as shown in FIG. 7B. Magnetic flux in magnetic circuits formed from magnets in arrays 702 and 704 flows in opposite directions in a ferromagnetic plate 770 separating the arrays 702 and 704. This largely cancels the magnetic field within the ferromagnetic plate 770, leading to low local flux densities. The ferromagnetic plate 770 is then less likely to become saturated, so its magnetic permeability will remain high. This may allow a thickness of the ferromagnetic plate 770 to be reduced, leading to a smaller, lighter motor.

Coil assemblies 710 and 720 are on opposite sides of the array 702 of permanent magnets, and coil assemblies 730 and 740 are on opposite sides of the array 704 of permanent magnets. The array 702 and coil assemblies 710 and 720 form a submotor 750, and the array 704 and coil assemblies 730 and 740 form a submotor 760. The submotors 750 and 760 are separated by a ferromagnetic plate 770. A ferromagnetic plate 772 is on a second side of the submotor 750 while a ferromagnetic plate 774 is on a second side of the submotor 760. The ferromagnetic plates 770, 772 and 774 contain soft iron, or some other material with high magnetic permeability, in some embodiments. For simplicity, it may be desirable that the coil assemblies in submotors 750 and 760 be identical, and that the magnet arrays be identical and aligned. This simplifies the control system. However, there is no fundamental need for this.

Figure 8:
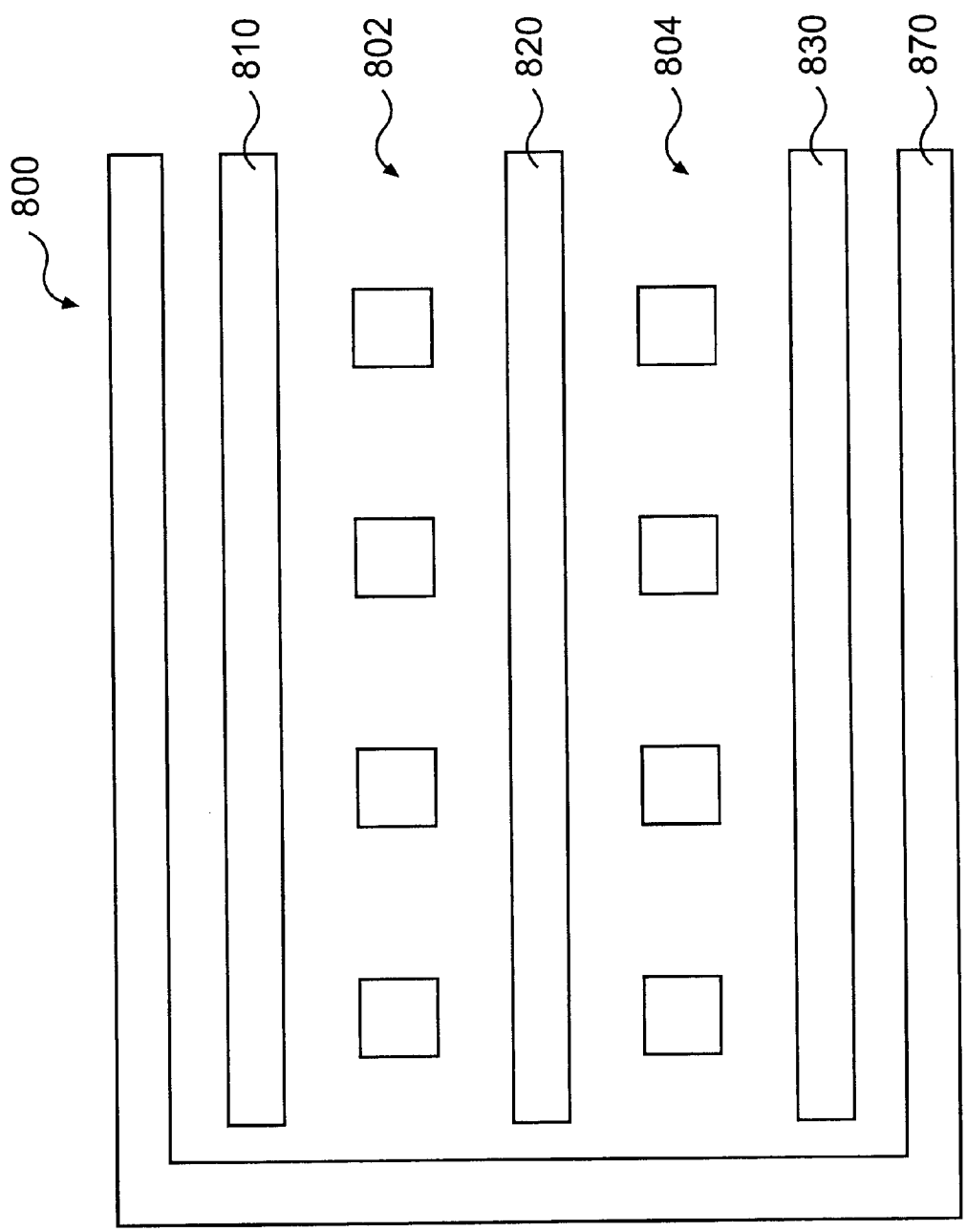
FIG. 8 diagrammatically illustrates a cross-sectional side view of an embodiment of a two-dimensional linear electric motor in accordance with the present invention.

FIG. 8 diagrammatically illustrates a cross-sectional side view of another embodiment 800 of a two-dimensional linear electric motor in accordance with the present invention. The embodiment 800 has arrays of permanent magnets 802 and 804. Coil assemblies 810 and 830 lie between permanent magnet arrays 802 and 804 and a ferromagnetic enclosure 870, and a coil assembly 820 lies between permanent magnet arrays 802 and 804. The coil assemblies 810 and 820 are on opposite sides of the array 802 of permanent magnets while the coil assemblies 820 and 830 are on opposite sides of the array 804. The ferromagnetic enclosure 870 surrounds the arrays 802 and 804 and the coil assemblies 810, 820, and 830. The ferromagnetic enclosure 870 contains soft iron in some embodiments.

This embodiment 800 has one fewer coil assembly, three, than the embodiment 700 in FIGS. 7A and 7B. However, the magnetic field in the gap between arrays 802 and 804 is somewhat larger than in the other 2 gaps, according to the description of FIG. 6. Therefore, for equal sized coils and electrical currents, this embodiment should provide more than three-fourths the force provided by the embodiment of FIG. 7A and 7B. Its smaller size and fewer coil assemblies may provide an advantage. However, since the different coil arrays operate now in magnetic fields of different magnitude, the control system may be slightly more complicated.

Although only a few exemplary embodiments of this invention have been described in detail above, those skilled in the art will readily appreciate that many modifications are possible in the exemplary embodiments without materially departing from the novel teachings and advantages of this invention. For example, although depicted as being planar, the arrays of magnetic poles, coils, and coil assemblies can have either constant or varying curvature in one or two-dimensions as in cylindrical, and spherical arrangements of permanent magnets and coil assemblies. For cylindrical arrangements, latitudinal and longitudinal directions may be defined, for example, in standard cylindrical with corresponding diagonal directions, and parallel arrays and coils lie on parallel surfaces. Accordingly, all such modifications are intended to be within the scope of the following claims.

I claim as my invention:

1. A two-dimensional electric motor comprising:
    an array of a multiplicity of permanent magnets having north and south poles distributed in both first and second directions and having first and second sides;
    a first plurality of coils disposed on said first side of said array, said first plurality of coils being responsive to electric current to generate magnetic fields; and
    a second plurality of coils disposed on said second side of said array, said second plurality of coils being responsive to electric current to cause said array and said first and said second plurality of coils to move relative to one another such that said first and said second plurality of coils are stationary with respect to each other.

2. A two-dimensional electric motor according to claim 1 wherein said multiplicity of magnets are periodically distributed in said first direction.

3. A two-dimensional electric motor according to claim 2 wherein said multiplicity of magnets are periodically distributed in said second direction.

4. A two-dimensional electric motor according to claim 1 wherein said array of magnets has two magnetic poles of a first polarity positioned along a diagonal with a magnetic pole of a second polarity between said two magnetic poles of the first polarity.

5. A two-dimensional electric motor as in claim 1 wherein currents in said first plurality of coils and currents in said second plurality of coils electromagnetically interact with said array to provide forces in at least one of said first and said second directions.

6. A two-dimensional electric motor as in claim 1 wherein said first plurality of coils includes a number of windings.

7. A two-dimensional electric motor as in claim 6 wherein each of said windings is associated with a phase.

8. A two-dimensional electric motor as in claim 7 wherein a plurality of windings are associated with a same phase, said windings being electrically connected to each other.

9. A two-dimensional electric motor as in claim 1 wherein said multiplicity of permanent magnets in said array includes a multiplicity of poles of one polarity.

10. A two-dimensional electric motor as in claim 9 wherein said first plurality of coils defines an area that is large enough to overlap said multiplicity of poles of said one polarity.

11. A two-dimensional electric motor as in claim 10 wherein said area is large enough to cover said multiplicity of poles of said one polarity.

12. A two-dimensional electric motor as in claim 1 wherein each of said first plurality of coils has a number of windings which is substantially parallel to said array of permanent magnets.

13. A two-dimensional electric motor as in claim 1 further comprising a ferromagnetic enclosure positioned about said first and said second plurality of coils and said array.

14. A two-dimensional electric motor as in claim 13 wherein said ferromagnetic enclosure contains soft iron.

15. A two-dimensional electric motor as in claim 13 wherein said coil is located a distance away from a first surface of said ferromagnetic enclosure and wherein said second coil is located said distance away from a second surface of said ferromagnetic enclosure.

16. A two-dimensional electric motor as in claim 15 wherein said first surface and said second surface are a same surface.

17. A two-dimensional electric motor as in claim 15 wherein said array is attached to said enclosure.

18. A two-dimensional electric motor comprising:
    a planar array of a multiplicity of permanent magnets having north and south poles distributed in both longitudinal and latitudinal directions and having first and second sides;
    a first coil disposed on said first side of said array, said first coil being responsive to electric current; and
    a second coil disposed on said second side of said array, said second coil being responsive to electric current to cause said array and said first and said second coils to move relative to one another such that said first and said second coils are stationary with respect to each other.

19. A two-dimensional electric motor as in claim 18 wherein an edge permanent magnet on an edge of said planar array has a strength approximately equal to one-half a strength of an interior permanent magnet which is part of said multiplicity of permanent magnets in said first planar array.

20. A two-dimensional electric motor as in claim 19 wherein a corer permanent magnet at a comer of said first array has a strength approximately equal to one-half the strength of said interior permanent magnet.

21. A two-dimensional electric motor as in claim 19 wherein a comer permanent magnet at a corner of said first array has a strength approximately equal to three-quarters the strength of said interior permanent magnet.

22. A two-dimensional electric motor as in claim 18 wherein said planar array is a rectangular array.

23. A two-dimensional electric motor as in claim 18 wherein a first width of said first coil is greater than a first width of said planar array.

24. A two-dimensional electric motor as in claim 23 wherein a second width of said first coil is not greater than a second width of said planar array.

25. A two-dimensional electric motor as in claim 18 wherein a first width of said first coil is less than a width of said planar array.

26. A two-dimensional electric motor as in claim 25 wherein a second width of said first coil is less than a second width of said planar array.

\* \* \* \* \*

UNITED STATES PATENT AND TRADEMARK OFFICE
CERTIFICATE OF CORRECTION

PATENT NO.     : 6,455,956 B1
DATED          : September 24, 2002
INVENTOR(S)    : Michael R. Sogard It is certified that error appears in the above-identified patent and that said Letters Patent is hereby corrected as shown below:

<u>Column 13,</u>
Line 5, "corer" should read -- corner --.
Lines 5 and 9, "comer" should read -- corner --.

Signed and Sealed this

Thirty-first Day of December, 2002

JAMES E. ROGAN
*Director of the United States Patent and Trademark Office*